United States Patent
Daval et al.

(10) Patent No.: US 7,285,495 B2
(45) Date of Patent: Oct. 23, 2007

(54) METHODS FOR THERMALLY TREATING A SEMICONDUCTOR LAYER

(75) Inventors: Nicolas Daval, Grenoble (FR); Takeshi Akatsu, St. Nazaire les Eymes (FR); Nguyet-Phuong Nguyen, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 284 days.

(21) Appl. No.: 11/058,992

(22) Filed: Feb. 16, 2005

(65) Prior Publication Data
US 2005/0196936 A1  Sep. 8, 2005

(30) Foreign Application Priority Data
Mar. 5, 2004  (FR) .................... 04 02340

(51) Int. Cl.
*H01L 21/302* (2006.01)
(52) U.S. Cl. ...................... 438/689; 438/766
(58) Field of Classification Search .............. 438/689, 438/766
See application file for complete search history.

(56) References Cited

U.S. PATENT DOCUMENTS

| | | | |
|---|---|---|---|
| 4,462,847 A | 7/1984 | Thompson et al. | 148/174 |
| 4,604,304 A | 8/1986 | Faraone et al. | 427/255 |
| 4,722,912 A | 2/1988 | Flatley et al. | 437/180 |
| 5,374,564 A | 12/1994 | Bruel | 438/455 |
| 5,882,987 A * | 3/1999 | Srikrishnan | 438/458 |
| 6,245,161 B1 | 6/2001 | Henley et al. | 148/33.4 |
| 6,352,942 B1 | 3/2002 | Luan et al. | 438/770 |
| 6,448,152 B1 | 9/2002 | Henley et al. | 438/458 |
| 6,562,703 B1 | 5/2003 | Maa et al. | 438/518 |

(Continued)

FOREIGN PATENT DOCUMENTS

EP  0 961 312  5/1999

(Continued)

OTHER PUBLICATIONS

Tong, Q.Y., et al., 1999, "Semiconductor Wafer Bonding Science & Technology", Wiley Interscience Publication, pp. 1-15, 81-99.

(Continued)

*Primary Examiner*—Nadine Norton
*Assistant Examiner*—Lynette T. Umez-Eronini
(74) *Attorney, Agent, or Firm*—Winston & Strawn LLP

(57) ABSTRACT

A method for thermally treating a semiconductor layer is described. An embodiment of the technique includes implanting atomic species into a first surface of a donor wafer to form a zone of weakness at a predetermined depth that defines the thickness of a transfer layer, bonding the first surface of the donor wafer to a host wafer, supplying energy to detach the transfer layer from the donor wafer at the zone of weakness, and conducting a recovery operation on the transfer layer. The recovery operation is conducted after detachment but while the layer remains in contact with the donor wafer. The recovery operation includes heat treating the transfer layer for a predetermined duration at a recovery temperature that is lower than a re-adhesion temperature at which the transfer layer would re-adhere to the donor wafer, to improve the crystalline quality and the surface roughness of the transfer layer.

19 Claims, 3 Drawing Sheets

U.S. PATENT DOCUMENTS

| | | |
|---|---|---|
| 6,603,156 B2 | 8/2003 | Rim .......................... 257/190 |
| 6,613,678 B1 * | 9/2003 | Sakaguchi et al. .......... 438/695 |
| 6,649,492 B2 | 11/2003 | Chu et al. ................... 438/478 |
| 6,717,213 B2 | 4/2004 | Doyle et al. ................ 438/407 |
| 6,756,286 B1 | 6/2004 | Moriceau et al. ........... 438/459 |
| 6,995,430 B2 | 2/2006 | Langdo et al. .............. 257/352 |
| 7,067,386 B2 | 6/2006 | Doyle et al. ................ 438/406 |
| 2002/0072130 A1 | 6/2002 | Cheng et al. ................. 438/10 |
| 2002/0140031 A1 | 10/2002 | Rim .......................... 257/347 |
| 2002/0185686 A1 | 12/2002 | Christiansen ................ 438/10 |
| 2003/0003679 A1 | 1/2003 | Doyle et al. ................ 438/406 |
| 2003/0124815 A1 | 7/2003 | Henley et al. .............. 438/460 |
| 2003/0153161 A1 | 8/2003 | Chu et al. ................... 438/478 |
| 2003/0203600 A1 | 10/2003 | Chu et al. ................... 438/479 |
| 2003/0227057 A1 | 12/2003 | Lochtefeld et al. ......... 257/347 |
| 2004/0005740 A1 | 1/2004 | Lochtefeld et al. ......... 438/149 |
| 2004/0031929 A9 | 2/2004 | Ahlers et al. ............. 250/458.1 |
| 2004/0031979 A1 | 2/2004 | Lochtefeld et al. ......... 257/233 |
| 2004/0053477 A1 | 3/2004 | Ghyselen et al. ........... 438/465 |
| 2004/0067622 A1 | 4/2004 | Akatsu et al. ............... 438/455 |
| 2004/0137698 A1 * | 7/2004 | Taraschi et al. ............ 438/458 |
| 2004/0157402 A1 | 8/2004 | Doyle et al. ................ 438/406 |
| 2004/0157409 A1 | 8/2004 | Ghyselen et al. ........... 438/458 |
| 2004/0173790 A1 * | 9/2004 | Yeo et al. ..................... 257/19 |
| 2004/0214434 A1 | 10/2004 | Atwater et al. ............. 438/689 |
| 2005/0156246 A1 | 7/2005 | Lochtefeld et al. ......... 257/347 |
| 2005/0189563 A1 | 9/2005 | Lochtefeld et al. ......... 257/192 |
| 2005/0199954 A1 | 9/2005 | Lochtefeld et al. ......... 257/347 |
| 2005/0205934 A1 | 9/2005 | Lochtefeld et al. ......... 257/347 |
| 2005/0212061 A1 | 9/2005 | Langdo et al. .............. 257/397 |
| 2005/0218453 A1 | 10/2005 | Langdo et al. .............. 257/352 |
| 2005/0280103 A1 | 12/2005 | Langdo et al. .............. 257/401 |
| 2006/0011984 A1 | 1/2006 | Currie ........................ 257/352 |
| 2006/0014363 A1 | 1/2006 | Daval et al. ................ 438/455 |
| 2006/0014366 A1 | 1/2006 | Currie ........................ 438/517 |

FOREIGN PATENT DOCUMENTS

| | | |
|---|---|---|
| EP | 0 971 395 A1 | 1/2000 |
| EP | 1 359 615 A1 | 11/2003 |
| FR | 2 842 350 | 1/2001 |
| FR | 2 842 349 | 1/2004 |
| JP | 06318588 | 11/1994 |
| WO | WO99/35674 | 7/1999 |
| WO | WO 03/105189 A2 | 12/2003 |
| WO | WO 2004/009861 A2 | 1/2004 |
| WO | WO 2004/027858 A1 | 4/2004 |

OTHER PUBLICATIONS

Agarwal, Aditya et al., 1998, "Efficient Production of Silicon-on Insulator Films by Co-implantation of He)+) with H(+)", Applied Physics Letters, 72:9, pp. 1086-1088.

Colinge, J. P., 1997, "Silicon-On-Insulator Technology", Materials to VLSI, 2nd Edition, pp. 50-51.

B. Hollander et al., "Strain Relaxation Of Pseudomorphic $Si_{1-x}Ge_x$/Si(100) Heterostructures After Hydrogen Or Helium Ion Implantation For Virtual Substrate Fabrication", Nuclear Instruments and Methods in Physics Research B 175-177, pp. 357-367 (2001).

Schaffler, Friedrich, 1997, "High Mobility Si and Ge Structures", Semicond. Sci. Technol., 12, pp. 1515-1549.

S.M. Sze , "Physics of Semiconductor Devices", John Wiley and Sons (NY), Inc. 2 J Edition (2002).

S. Wolf et al., "Silicon processing for the VLSI era" vol. I—Process Technology, Lattice Press (USA), 2nd Edition (2000).

* cited by examiner

METHODS FOR THERMALLY TREATING A SEMICONDUCTOR LAYER

FIELD OF THE INVENTION

The invention relates to methods for forming a semiconductor structure that includes a transfer layer taken from a donor wafer. The techniques include implanting atomic species to form a zone of weakness zone in the donor wafer that defines a transfer layer, bonding the donor wafer to a host wafer, supplying energy to detach the transfer layer from the donor wafer at the zone of weakness zone, and treating the transfer layer.

BACKGROUND ART

A semiconductor layer transfer method called SMART-CUT® is known to those skilled in the art. Details of this method may be found in many published documents, for example, on pages 50 and 51 of: "Silicon on Insulator Technology: Material to VLSI, Second Edition", "by Jean-Pierre Colinge, published by "Kluwer Academic Publishers". A second step of bonding the host wafer (the recipient of the transfer layer) typically takes place on the surface of the donor wafer and includes using a bonding layer made of dielectric material such as $SiO_2$. In this manner a semiconductor-on-insulator structure may be formed, such as an SOI structure (in the case where the transferred layer is made of silicon), SiGeOI (when the transferred layer is made of germanium silicon), sSOI (when the transferred layer is made of strained silicon), or GeOI (when the transferred layer is made of germanium).

During the detaching step, thermal energy typically is at least partially utilized. In this case, the thermal budget (the combination of temperature and duration of the heat treatment) must be considered to determine the moment at which the transfer layer will be detached. It has been observed that after detachment of the transfer layer, the latter may have quite a rough surface, as well as a lower quality crystalline surface structure, resulting from the previous implantation and detachment steps.

FIG. 1 illustrates a semiconductor-on-insulator structure 30 that includes a host wafer 20, an electrically isolating layer 5, and a transferred layer 1. The semiconductor part, which is the transferred layer 1, has a reduced crystalline quality surface. In particular, the transferred layer 1 includes a defective zone 1A that has crystalline defects and a detrimental surface roughness. The defective zone 1A typically has a thickness of around 150 nm, and the implantation step may have caused a reduction in the crystalline quality in the transfer layer 1. It is thus necessary to treat the transfer layer 1 to remove the defective zone 1A, and thus to reclaim at least part of the sound zone 1B of the transfer layer 1. Typically, the defective zone 1A is oxidized and then subsequently removed by chemically etching using hydrofluoric acid HF (a treatment called sacrificial oxidation). A finishing step is then used, such as mechanically polishing or chemically-mechanically polishing. Such a treatment step for the transferred layer 1 is costly and complex.

Furthermore, the use of such treatment means requires the systematic removal of the negative of the donor wafer to obtain access to the surface of the transferred layer 1. The wafers must therefore be removed from the furnace (in which heat treatment was conducted). This results in a loss of time, extra wafer handling and the need to use suitable equipment.

Published French application 2,842,349 describes a method that attempts to overcome these problems, by including a stop layer between the future defective zone 1A and the underlying future sound zone 1B. In this example, the transfer layer is made of SiGe and the stop layer is made of Si. This publication also teaches to improve the finishing operations by using selective double etching (of the defective zone 1A and the stop layer), to substantially reduce the roughness as measured from their maximum values (peaks and valleys) and depending on their quadratic values (in RMS Angstroms) on the surface of the SiGe sound zone 1B.

However, selective etching is imprecise, and thus a roughness remains at the tip or edge of the first chemical etching step which is at the interface between the defective zone 1A and the stop layer. Chemical etching therefore unequally treats the surface of the stop layer. In addition, since the stop layer is generally fairly thin, the first selective etching process can pass through it and attack the underlying sound zone 1B. The same document proposes to polish before selectively etching, in order to eliminate some of these potential problems. However, the combination of polishing and selective etching further adds to the complexity and cost of the operation, which could make the overall operation unprofitable.

In published French application 2,842,350 the transferred layer 1 is composed of a sound zone 1B made of strained Si and a defective zone 1A of SiGe. The defective zone is selectively removed from the sound zone 1B. A similar problem exists here analogous to that discussed above, wherein the surface of sound zone 1B is unequally etched because the tip of the etching portion reached it.

BRIEF SUMMARY OF THE INVENTION

The invention overcomes these problems by presenting methods for forming a semiconductor structure that includes a transfer layer having a good crystalline quality and an improved surface roughness characteristic. An embodiment of the technique includes implanting atomic species into a first surface of a donor wafer to form a zone of weakness at a predetermined depth that defines the thickness of a transfer layer, bonding the first surface of the donor wafer to a host wafer, supplying energy to detach the transfer layer from the donor wafer at the zone of weakness, and conducting a recovery operation on the transfer layer. The recovery operation is conducted after detachment but while the layer remains in contact with the donor wafer. The recovery operation includes heat treating the transfer layer for a predetermined duration at a recovery temperature that is lower than a re-adhesion temperature at which the transfer layer would re-adhere to the donor wafer, to improve the crystalline quality and the surface roughness of the transfer layer.

In an advantageous embodiment, the re-adhesion temperature is about 800° C., so that the recovery operation includes heat treating the transfer layer for at least 30 minutes at a temperature that is at least about 300° C. but is less than 800° C. In a variation, the recovery temperature is between about 550 to about 650° C. Advantageously, the method also includes conducting the recovery operation in an inert, oxidizing or slightly oxidizing atmosphere and the atmosphere may include argon, nitrogen, or a mixture thereof. In a beneficial implementation, the detachment and treating steps are conducted in the same furnace. In addition, the supply of energy to detach the transfer layer may be achieved by heating the donor wafer and transfer layer to a detachment temperature, and the heating during the recovery operation includes increasing the temperature to a predetermined level that is above the detachment temperature. In an embodiment, energy is supplied by heating at about 500° C. for between about 30 minutes and about 2 hours to detach the transfer layer, and the recovery operation includes heating to a temperature of about 600° C. for between about 30 minutes and 2 hours.

In a beneficial implementation, the implanting step may include implanting hydrogen or helium, or may include co-implanting hydrogen and helium. In an implementation, co-implanting involves implanting a first species at a predetermined energy, and then implanting a second species at a predetermined energy.

In another advantageous embodiment, the method also includes removing the transfer layer from the donor wafer after the recovery operation. The technique may also include conducting at least one of chemical-mechanical polishing, chemical etching, sacrificial oxidation, or heat annealing on the transfer layer. In an implementation, the transfer layer is made of $Si_{1-x}Ge_x$ where $0<x\leq1$. In a variation, the transfer layer is made of strained Si and $Si_{1-x}Ge_x$ where $0<x\leq1$, and may further include selectively etching the layer of $Si_{1-x}Ge_x$ with respect to the strained Si layer after the treating step. In another advantageous embodiment, the transfer layer is made of $Si_{1-x}Ge_x$, where $x\neq0$, and a stop layer, and the treating step includes selectively etching the stop layer after the recovery operation and after removing the transfer layer from a remaining part of the donor wafer. In a variation, the donor wafer includes a support substrate made of solid Si, a buffer structure made of SiGe, and an upper layer comprising $Si_{1-x}Ge_x(X\neq0)$, and wherein the host wafer is made of strained Si.

In another beneficial embodiment, the method includes, prior to the bonding step, forming a bonding layer of an electrically insulating material on at least one of the donor wafer and the host wafer. The electrically insulating material may be made of at least one of $SiO_2$, $Si_3N_4$ or $Si_xO_yN_z$, and a semiconductor on insulator structure is formed. In addition, the method may include removing the transfer layer from a remaining part of the donor wafer after the a recovery operation to form a structure having a transfer layer with a surface roughness of less than 40 Å RMS.

The invention advantageously reduces the duration, economic cost and number of treatment devices required for transferring a layer using the SMART-CUT® process. In addition, the method provides a simple way to treat a transfer layer that is easy to incorporate into the SMART-CUT® process, and provides a way to use a recovery heat treatment for the transfer layer both in inert atmosphere and in oxidizing atmosphere without substantially altering the properties of the transfer layer. Further, the method according to the invention improves the crystalline quality of the transfer layer, and makes it possible to produce semiconductor on insulator structures with high crystalline quality and a working layer thickness that can be very thin. The method also reduces the quantity of material removed during treatment of the transfer layer using the SMART-CUT® process. Lastly, the method according to the invention makes it possible to utilize SiGe or Ge for fabricating a semiconductor on insulator structure.

BRIEF DESCRIPTION OF THE DRAWING FIGURES

Other aspects, purposes and advantages of the invention will become clear after reading the following detailed description with reference to the attached drawings, in which.

DETAILED DESCRIPTION OF THE PREFERRED EMBODIMENTS

Presented below are examples of methods according to the invention, as well as applications, based on transfer layers obtained by using the SMART-CUT® process with Type IV materials or alloys, and in particular with $Si_{1-x}Ge_x$ where $x\neq0$.

Figure 3A:
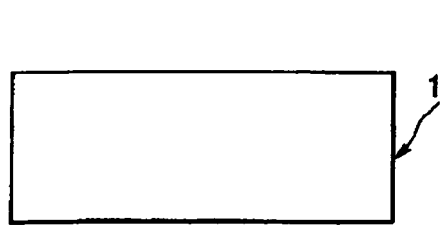
FIGS. 3a to 3f are simplified diagrams illustrating the different steps of a method according to the invention for forming a structure that includes a transfer layer using the SMART-CUT® technique.

Referring to FIGS. 3a to 3f, a first method is depicted for transferring a layer of $Si_{1-x}Ge_x$ where $x\neq0$ from a donor wafer to a host wafer. In FIG. 3a, a donor wafer 10 includes a $Si_{1-x}Ge_x$ layer that is to be transferred. Classically, a donor wafer 10 including $Si_{1-x}Ge_x$ comprises a solid Si substrate upon which a buffer structure of SiGe (not shown) has been formed that is made of different layers. The SiGe buffer structure is fabricated to have a gradually increasing amount of Ge through its thickness, starting from 0% at the solid Si substrate level to about 100% at the level of the interface with the upper layer made of $Si_{1-x}Ge_x$. Of course, the donor wafer 10 may have any other configuration for which a layer of $Si_{1-x}Ge_x$ that is either relaxed or not is present in the upper part. Optionally, a layer of strained Si may be formed by crystalline growth (for example CVD) on the $Si_{1-x}Ge_x$ layer.

Figure 3B:
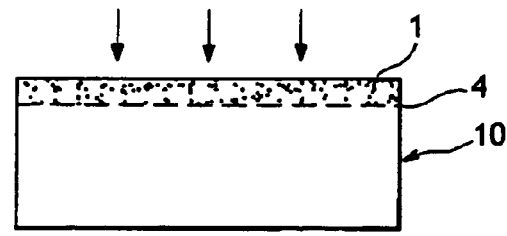

FIG. 3b illustrates the formation of a zone of weakness 4 in the donor wafer 10 at a level in the upper part which is made of $Si_{1-x}Ge_x$. The zone of weakness 4 is preferably formed by implanting atomic species whose dosage, nature and energy are chosen so that a predetermined implantation depth and a weakness level are achieved. The implantation of atomic species may be a simple implantation (implanting a single atomic type), such as implanting hydrogen, helium or a rare gas. The implantation of atomic species may include co-implanting atomic species (implanting at least two atomic species), such as co-implanting hydrogen and helium. When using co-implantation, it has been observed that the zone of weakness 4 is generally thinner than when a simple implantation process is used.

The implantation depth is chosen so that it is close to or greater than the desired thickness of the transfer layer 1. Thus, for a single implantation process using hydrogen at approximately $6\times10^{16}/cm^2$ and energy of between 20 and 60 kev, an implantation depth of around 300 to 600 nanometers is achieved. Thus, for a co-implantation process using helium of around $0.9 \times 10^{16}/cm^2$ and an energy value of between 50 and 90 kev and using hydrogen at $10^{16}/cm^2$ and an energy value of between 20 and 60 kev, an implantation depth of around 300 to 600 nanometres can be obtained. In an implementation of co-implantation, a first species is implanted at a predetermined energy and then a second species is implanted at a predetermined energy.

Figure 3C:
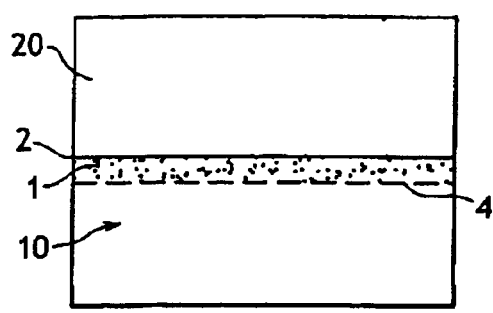

FIG. 3c illustrates a bonding step wherein a host wafer 20 is bonded to the side of the donor wafer 10 that underwent the co-implantation process. The host wafer 20 may be made of solid silicon (Si). Prior to the implantation step, a bonding layer may be formed on one and/or on the other of the respective surfaces that are to be bonded. Such a bonding layer may be made of $SiO_2$, $Si_3N_4$, or $Si_xO_yN_z$. When such bonding layer(s) are made of $SiO_2$, they may be formed by thermal oxidation or by depositing $SiO_2$. Thermal oxidation of the host wafer 20 is usually preferred as it uses, in most cases, Si oxidation. Thermal oxidation of the donor wafer 10 may be carried out at the level of the transfer layer 1 of $Si_{1-x}Ge_x$.

Prior to the host wafer 20 coming into contact with the donor wafer 10, the bonding surfaces may be prepared, using known cleaning and surface preparation techniques such as SC1 and SC2 solutions, ozone solutions, and the like. Bonding may first be conducted by molecular adhesion, taking account of the hydrophilic properties of each of the two bonding surfaces. Second, and in particular when one or more bonding layers are positioned between the donor wafer 10 and the host wafer 20, a heat treatment may be conducted after the recovery operation discussed below, to further strengthen the bonding by creating covalent links. In this latter case, and for a bonding layer made of $SiO_2$, $Si_3N_4$ or $Si_xO_yN_z$, the bonding temperature will be greater than the creep temperature of the bonding layers, which is greater than a temperature of about 1050° C. Information on the bonding techniques that may used within the scope of the present process may be found, for example, in the document "Semiconductor Wafer Bonding: Science and Technology" by Q. Y. Tong and U. Gösele, Johnson Wiley and Sons, Inc., 1999.

Figure 3D:
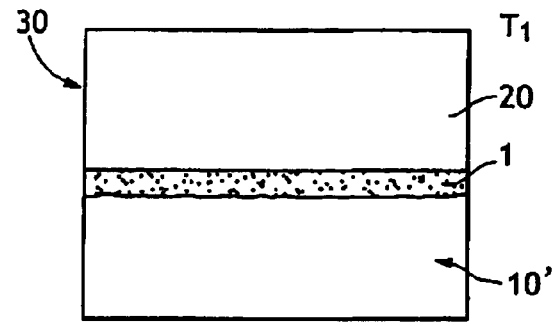
Figure 3E:
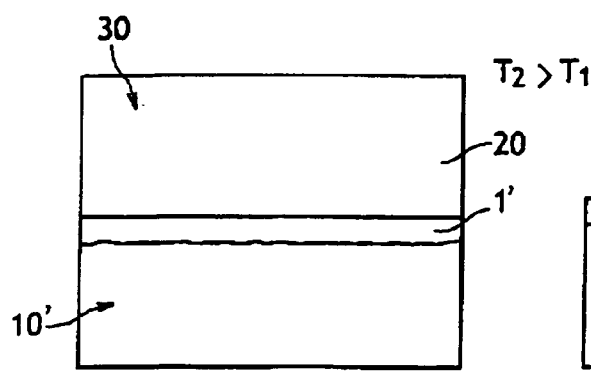

FIGS. 3d and 3e illustrate the detachment and recovery steps, respectively, of the transfer layer 1. Referring to FIG. 3d, detaching is conducted by providing heat energy and/or mechanical energy that is sufficient to break the weak links at the zone of weakness 4, and thus to detach the transfer layer 1 from the rest of the donor wafer 10'. This heat energy may be sufficient to cause thermal effects on the gaseous species enclosed at the zone of weakness 4 level to cause a rupture of the weak links, without any mechanical intervention being required. Detachment may occur at temperatures of between about 300° C. and about 550° C. for durations of varying length, which depend on whether the temperature is lower (longer) or higher (shorter). For example, for a transfer layer to be removed from a $Si_{1-x}Ge_x$ substrate, a heat treatment may be utilized at a temperature of around 500° C. for a duration that can range from about 15 to 30 minutes up to about 2 hours. The detachment of the transfer layer 1 from the rest of the donor wafer 10', carried out using only heat, permits the transfer layer 1 to be detached without breaking the contact with the rest of the donor wafer 10' (see FIG. 3d). In particular, as shown in FIG. 3d, the transfer layer 1 is in non-adhering contact with the donor wafer 10' under the force of gravity. It is then possible to conduct a recovery heat treatment directly after detachment, without necessarily removing the wafers from the furnace (in which the detaching heat treatment took place), and without the need for any additional handling. Moreover, the remaining part of the donor wafer 10' protects the transfer layer 1 from any possible contaminants, oxidants or other such agents, which also permits using a heat treatment again in various atmospheres.

FIG. 3e illustrates a recovery operation that is conducted by using a heat treatment at a temperature $T_2$ that is chosen to be less than a re-adhesion temperature at which the transfer layer 1 re-adheres joins together again) to the remaining part of the donor wafer 10'. Based on experience, the re-adhesion temperature is equal to approximately 800° C. Optionally, the temperature $T_2$ may be greater than the temperature $T_1$ which the wafers 10 and 20 were subjected to when detachment occurred. This recovery heat treatment on the transfer layer 1 is conducted in an inert, oxidizing or slightly oxidizing atmosphere (such as an Ar or $N_2$ atmosphere). The temperature $T_2$ may, for example, be in the range of between about 350° C. and about 800° C. The temperature $T_2$ may even be situated between about 550° C. and about 800° C.

Figure 4:
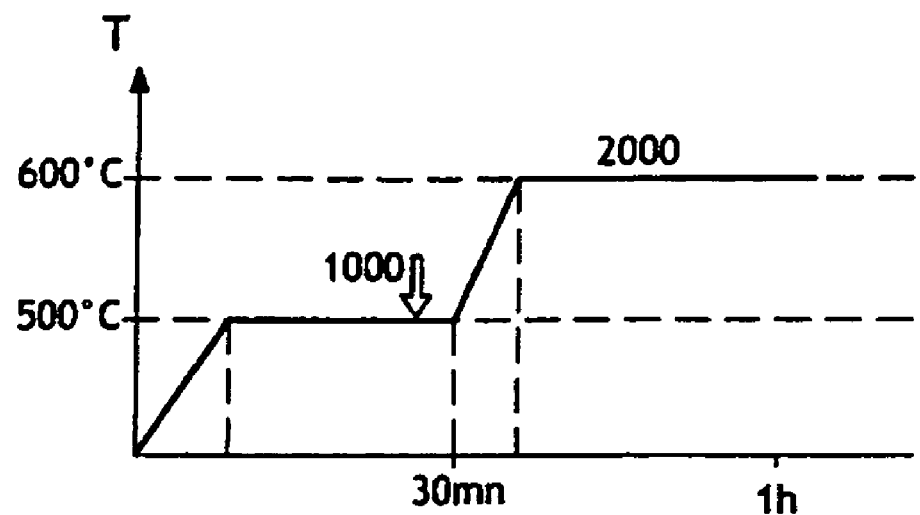
FIG. 4 is a graph illustrating a first set of heat treatment temperatures over time used during the detaching step and during the treatment of the transfer layer according to the method shown in FIGS. 3a to 3f.
Figure 5:
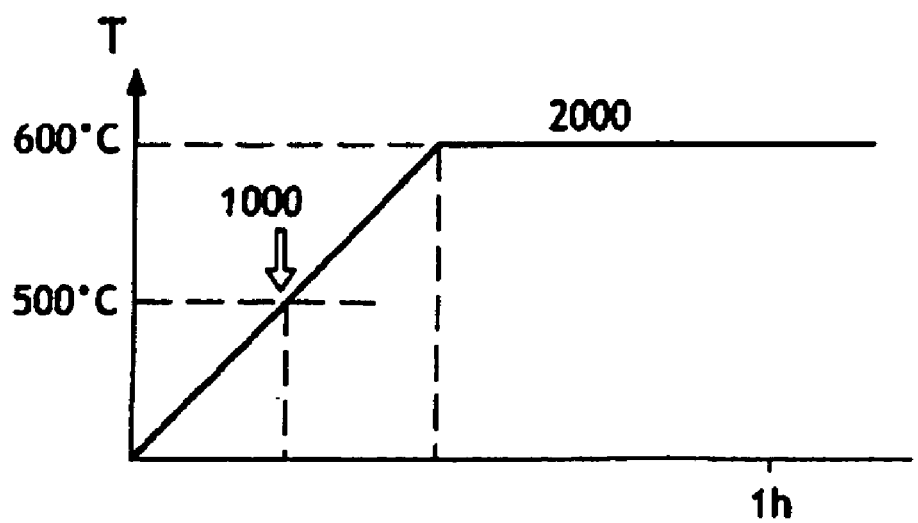
FIG. 5 is a graph illustrating a second set of heat treatment temperatures over time used during the detaching step and during the treatment of the transfer layer according to the method shown in FIGS. 3a to 3f.

FIGS. 4 and 5 illustrate examples of possible temperature profiles according to the method that include the bonding and recovery phases. Referring to FIG. 4, a first plateau at around 500° C. is reached and maintained for about 30 minutes to create detachment, referenced by the arrow 1000. Next, the temperature is increased to approximately 600° C. to conduct the recovery operation according to the invention as referenced by the temperature plateau 2000. This recovery operation may last for between about 30 minutes and about 2 hours. The recovery temperature may thus be held constant for between about 30 and about 60 minutes.

FIG. 5 illustrates detachment occurring not during a temperature plateau, but instead during a temperature increase to about 500° C. (referenced by the arrow 1000 in FIG. 5). Next, the recovery operation temperature plateau 2000 is reached at a temperature of about 600° C. Surprisingly, it has been observed that by using such a recovery operation step on the transfer layer 1, the transfer layer had an improved crystalline quality in parts that were damaged during implantation (see FIG. 3b) and during detachment (see FIG. 3d). The transfer layer 1 also had a smooth surface, in particular with regard to high frequency roughness (HF roughness).

Figure 3F:
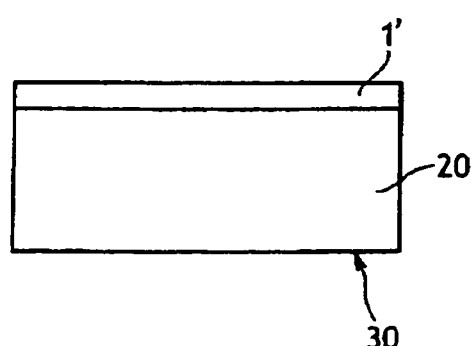

FIG. 3f illustrates the final structure 30 achieved after contact between the remaining part of the donor wafer 10' and the recovered transfer layer 1' is removed. The structure 30 includes the recovered transfer layer 1' made of $Si_{1-x}Ge_x$ and the host wafer 20. This structure 30 has an improved crystalline quality and reduced roughness, without needing a sacrificial oxidation operation and without any significant loss of part of the transfer layer 1. In the case where a bonding layer was formed between the transfer layer 1 and the host wafer 20, and/or in the case of the host wafer 20 being made of an electrically insulating material such as quartz or glass, then a SiGeOI or GeOI structure is obtained. Finishing steps such as CMP, polishing, or chemical etching, may then be used to remove any slight roughness and the few remaining crystalline defects at the surface. Optionally, a layer of Si may be added by epitaxy onto the $Si_{1-x}Ge_x$ layer so that it is elastically strained.

In an embodiment, a layer of strained Si is formed prior to it being transferred from the $Si_{1-x}Ge_x$ layer. In this case, the transfer layer 1 comprises a layer of $Si_{1-x}Ge_x$ and a layer of strained Si. The structure obtained after detachment is then an SGOI structure, which is a semiconductor on insulator structure that includes in its semiconductor part a layer of $Si_{1-x}Ge_x$ and a layer of strained Si. The layer of $Si_{1-x}Ge_x$ may be removed, for example, by using a selective etching process using $HF:H_2O_2:CH_3COOH$, in order to obtain the final sSOI structure.

In another specific embodiment, where the transfer layer of $Si_{1-x}Ge_x$ comprises one or more stop layers, such as a layer of $Si_{1-x}Ge_y$ where y ∈ [0;1] and y≠x (formed in the transfer layer, prior to detaching), at least one selective etching process can be advantageously conducted (which may be combined with a polishing step). Known solutions could be used which would permit a particularly effective finishing step to be carried out, as recently taught in the French publications FR 2,842,349 and FR 2,842,350.

The layer of $Si_{1-x}Ge_y$ may, for example, be Si elastically strained by the neighboring $Si_{1-x}Ge_x$ (where y=0). In fact, because the previous recovery operation considerably reduces the surface roughness and the non-uniformities of thickness in the transfer layer 1, it is then possible to use selective etching that is more or less identical to known techniques, and to eliminate the disadvantages that they may present (described previously).

Figure 1:
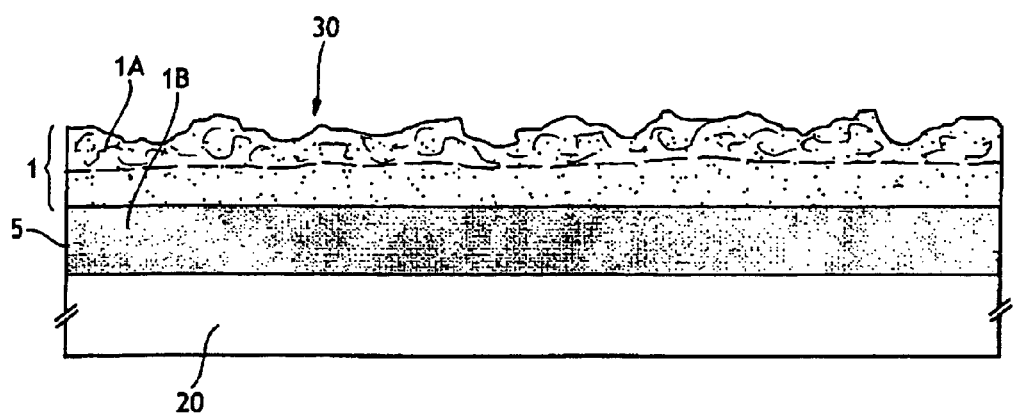
FIG. 1 is a diagrammatical cross section of a semiconductor on insulator structure obtained by using a SMART-CUT® method.
Figure 2:
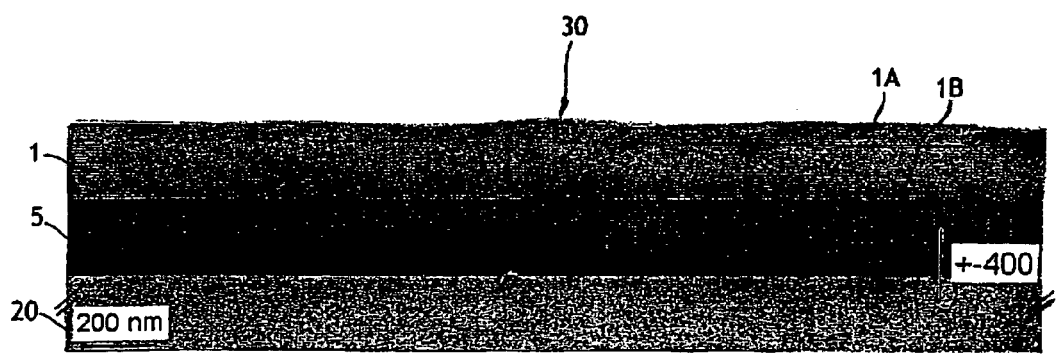
FIG. 2 is a cross sectional view obtained by TEM of a semiconductor on insulator structure obtained by using a method according to the invention.

FIG. 2 is a photograph of a structure 30 made of SiGeOI which is 20% Ge (photographed by TEM) that was obtained following a post-detachment recovery heat treatment transfer at 600° C. It shows a recovered transfer layer 1' (covering a layer of $SiO_2$ 5) that comprises very few crystalline defects and has very little roughness with respect to the semiconductor on insulator structure of FIG. 1. In particular, the disproportion between the thickness of the defective zone 1A of the transfer layer 1 of FIG. 1 and that of the remedied transfer layer 1' shown in FIG. 2 should be noted. Similarly, and for the same thickness of the transfer layer 1 for FIG. 1 and for FIG. 2, the sound zone 1B is much greater proportionally in the SGOI structure obtained according to the present method than for the semiconductor on insulator according to the state of the art technique. Moreover, the results from surface roughness measurements made on such a SGOI structure with 20% Ge are presented in the table below. These measurements were made just after detachment at 500° C. for about 30 minutes following simple implantation or co-implantation, and a recovery treatment at about 500° C. or at about 600° C. The roughness was measured and the values are given in RMS or peak to valley (PV) by AFM on surface areas of 10×10 µm. It should be noted that a sufficient number of measurements were made to validate the results.

| Nature of the implantation | Bonding strengthening treatment | Surface roughness | |
|---|---|---|---|
| | | RMS (Å) | PV (Å) |
| Simple implantation | | | |
| H: 40 keV–6.10$^{16}$/cm$^2$ | 500° C./30 min. | 80–85 | 850 |
| | 600 C./30 min. | 38 | 420 |
| Co-implantation of H and He: | | | |
| H: 35 keV–1.0.10$^{16}$/cm$^2$ | 500° C./30 min. | 49 | 407 |
| He: 70 keV–0.9.10$^{16}$/cm$^2$ | 600° C./30 min. | 25–33 | 200–272 |

Referring to the table, it can be noted that in the case of a co-implantation, a recovery treatment at about 600° C. reduces by almost a third both the mean (RMS) and maximum (PV) roughness with respect to the same heat treatment conducted at the detachment temperature (of approximately 500° C.). The roughness is less than 40 ÅRMS or even less than 35 ÅRMS, and below 300 ÅPV or even below 275 ÅPV. These measurements establish that there is significantly less roughness when the transfer layer 1 has undergone a recovery treatment. From the table, it may also be observed that there is less roughness in the case of co-implantation than in the case of single implantation. Of course, those skilled in the art can easily extrapolate the present method to work with materials other than $Si_{1-x}Ge_x$, given that the properties and physical characteristics associated with these other materials are known. Thus, the method can be adapted for use with other transfer layers made of, for example, Type III-V or Type II-VI alloys. The range of materials can also be extended to include those having carbon in small quantities (around 5%), or doping agents.

Thus, a technique has been presented for forming a semiconductor structure that includes a transfer layer obtained from a donor wafer. The method includes implanting atomic species to form a zone of weakness in the donor wafer that is at a depth close to the thickness of the transfer layer, bonding the donor wafer to a host wafer, supplying energy to detach the transfer layer from the donor wafer at the level of the zone of weakness, and then treating the transfer layer. In an implementation, the treating step includes a recovery operation conducted when the transfer layer is still in contact with the remaining part of the donor wafer. The recovering operation is applied by means of a heat treatment at a temperature that is lower than a re-adhesion temperature wherein the transfer layer would re-adhere to the remaining part of the donor wafer.

In implementations according to the invention, the re-adhesion temperature is approximately 800° C., the detachment step occurs at a temperature of between about 300° C. and about 550° C., the recovery operation occurs at a temperature between about 350° C. and about 800° C. In an implementation, the recovery temperature is between about 550° C. and about 800° C. In a variant, the recovery operation is conducted in an inert atmosphere, such as an Ar or $N_2$ atmosphere, or in an oxidizing atmosphere. In addition, the implanting step may include a co-implantation of hydrogen and helium, or a simple implantation of hydrogen or helium. Further, the recovery operation may be conducted in continuity with detachment step in the same furnace, and the recovery operation may include a single change of temperature from the detachment temperature up to a predetermined recovery temperature. The detachment step may be conducted at about 500° C. for between about 30 minutes to about 2 hours.

In an embodiment according to the invention, the transfer layer is removed from the rest of the donor wafer after the recovery operation, and it is possibly subjected to a finishing operation, The finishing operation could include at least one of the following operations: chemical mechanical polishing (CMP), chemical etching, sacrificial oxidation, and heat annealing.

In an implementation, the transfer layer is made of $Si_{1-x}Ge_x$ where 0<x≦1. In another implementation, the transfer layer comprises $Si_{1-x}Ge_x$ where x≠0, and a stop layer. The stop layer is selectively etched after the recovery operation and after the transfer layer has been removed from the remaining part of the donor wafer. In a variant, the donor wafer includes a support substrate made of solid Si, a buffer structure made of SiGe, and an upper layer comprising $Si_{1-x}Ge_x$ (x≠0). In addition, the host wafer is made of solid Si. In another embodiment, the method also includes, prior to the bonding step, forming a bonding layer on the donor wafer and/or on the host wafer, wherein the bonding layer is made of an electrically insulating material such as $SiO_2$, $Si_3N_4$ or $Si_xO_yN_z$.

According to a second aspect, the invention may be used to form a semiconductor on insulator structure. A third aspect according to the invention is a semiconductor on insulator structure obtained after the recovery operation and after the transfer layer has been removed from contact with the remaining part of the donor wafer, to present a surface having a roughness of less than 40 ARMS.

What is claimed is:

1. A method for thermally treating a semiconductor layer, comprising:
    implanting atomic species into a first surface of a donor wafer to form a zone of weakness at a predetermined depth that defines the thickness of a transfer layer;
    bonding the first surface of the donor wafer to a host wafer;
    supplying energy to detach the transfer layer from the donor wafer at the zone of weakness; and
    conducting a recovery operation on the transfer layer after detachment but while the layer remains in contact with the donor wafer, with the recovery operation comprising heat treating the transfer layer for a predetermined duration at a recovery temperature that is lower than a re-adhesion temperature at which the transfer layer would re-adhere to the donor wafer, to improve crystalline quality and surface roughness of the transfer layer.

2. The method of claim 1, wherein the re-adhesion temperature is about 800° C. so that the recovery operation includes heat treating the transfer layer for at least 30 minutes at a temperature that is at least about 300° C. but is less than 800° C.

3. The method of claim 1, wherein the recovery temperature is between about 550° C. and 650° C.

4. The method of claim 1, which further comprises conducting the recovery operation in an inert, oxidizing or slightly oxidizing.

5. The method of claim 4, wherein the atmosphere includes argon, nitrogen, or a mixture thereof.

6. The method of claim 1, wherein the detachment and treating steps are conducted in the same furnace.

7. The method of claim 6, wherein the supply of energy to detach the transfer layer is achieved by heating the donor wafer and transfer layer to a detachment temperature, and the heating during the recovery operation comprises increasing the temperature to a predetermined level that is above the detachment temperature.

8. The method of claim 7, wherein energy is supplied by heating at about 500° C. for between about 30 minutes and about 2 hours to detach the transfer layer and the recovery operation includes heating to a temperature of about 600° C. for between about 30 minutes and 2 hours.

9. The method of claim 1, wherein the implanting step comprises implanting hydrogen or helium or co-implanting hydrogen and helium.

10. The method of claim 1, which further comprises removing the transfer layer from the donor wafer after the recovery operation.

11. The method of claim 10, which further comprises conducting at least one of chemical-mechanical polishing, chemical etching, sacrificial oxidation, or heat annealing on the transfer layer.

12. The method of claim 1, wherein the transfer layer is made of $Si_{1-x}Ge_x$ where $0<x\leqq 1$.

13. The method of claim 1, wherein the transfer layer is made of strained Si and $Si_{1-x}Ge_x$ where $0<x\leqq 1$.

14. The method of claim 13, which further comprises selectively etching the layer of $Si_{1-x}Ge_x$ with respect to the strained Si layer after the treating step.

15. The method of claim 1, wherein the transfer layer comprises $Si_{1-x}Ge_x$, where $x\neq 0$, and a stop layer, and wherein the treating step comprises selectively etching the stop layer after the recovery operation and after removing the transfer layer from a remaining part of the donor wafer.

16. The method of claim 1, wherein the donor wafer comprises a support substrate made of solid Si, a buffer structure made of SiGe, and an upper layer comprising $Si_{1-x}Ge_x$ ($X\neq 0$), and wherein the host wafer is made of strained Si.

17. The method of claim 1, which further comprises, prior to the bonding step, forming a bonding layer of an electrically insulating material on at least one of the donor wafer and the host wafer.

18. The method of claim 17, wherein the electrically insulating material is at least one of $SiO_2$, $Si_3N_4$ or $Si_xO_yN_z$, and a semiconductor on insulator structure is formed.

19. The method of claim 1, which further comprises removing the transfer layer from a remaining part of the donor wafer after the a recovery operation to form a structure having a transfer layer with a surface roughness of less than 40 Å RMS.

* * * * *

UNITED STATES PATENT AND TRADEMARK OFFICE
CERTIFICATE OF CORRECTION

PATENT NO. : 7,285,495 B2 Page 1 of 1
APPLICATION NO. : 11/058992
DATED : October 23, 2007
INVENTOR(S) : Daval et al.

It is certified that error appears in the above-identified patent and that said Letters Patent is hereby corrected as shown below:

<u>Column 9</u>:
Line 39 (claim 4, line 3), after "slightly oxidizing" insert -- atmosphere --.

Signed and Sealed this

Twenty-fifth Day of December, 2007

JON W. DUDAS
*Director of the United States Patent and Trademark Office*